United States Patent
Habitz et al.

(10) Patent No.: US 7,302,673 B2
(45) Date of Patent: Nov. 27, 2007

(54) METHOD AND SYSTEM FOR PERFORMING SHAPES CORRECTION OF A MULTI-CELL RETICLE PHOTOMASK DESIGN

(75) Inventors: Peter Anton Habitz, Hinesburg, VT (US); David James Hathaway, Underhill, VT (US); Jerry D. Hayes, Milton, VT (US); Anthony D. Polson, Jericho, VT (US); Tad Jeffrey Wilder, South Hero, VT (US)

(73) Assignee: International Business Machines Corporation, Armonk, NY (US)

( * ) Notice: Subject to any disclaimer, the term of this patent is extended or adjusted under 35 U.S.C. 154(b) by 156 days.

(21) Appl. No.: 11/162,586

(22) Filed: Sep. 15, 2005

(65) Prior Publication Data

US 2007/0061771 A1 Mar. 15, 2007

(51) Int. Cl.
*G06F 17/50* (2006.01)
(52) U.S. Cl. .......................................... 716/21; 716/19
(58) Field of Classification Search .................. 716/19, 716/21; 382/144–145
See application file for complete search history.

(56) References Cited

U.S. PATENT DOCUMENTS

| | | | |
|---|---|---|---|
| 5,087,537 A | 2/1992 | Conway et al. | |
| 5,811,211 A | 9/1998 | Tanaka et al. | |
| 6,035,108 A | 3/2000 | Kikuchi | |
| 6,645,701 B1 | 11/2003 | Ota et al. | |
| 7,000,208 B2 * | 2/2006 | Zhang | 716/11 |
| 2004/0091793 A1 | 5/2004 | Maruko | |
| 2004/0175634 A1 * | 9/2004 | Cote et al. | 430/5 |
| 2004/0221255 A1 * | 11/2004 | Pierrat et al. | 716/21 |
| 2004/0223157 A1 | 11/2004 | Nakajima | |
| 2004/0227918 A1 | 11/2004 | Kurosawa | |
| 2005/0166173 A1 * | 7/2005 | Cote et al. | 716/19 |
| 2006/0008135 A1 * | 1/2006 | Nojima | 382/145 |
| 2006/0190920 A1 * | 8/2006 | Sakurai et al. | 716/21 |
| 2006/0195809 A1 * | 8/2006 | Cohn et al. | 716/10 |
| 2006/0222964 A1 * | 10/2006 | Futatsuya et al. | 430/5 |
| 2006/0236296 A1 * | 10/2006 | Melvin et al. | 716/20 |

FOREIGN PATENT DOCUMENTS

JP 62209826 A 9/1987

* cited by examiner

*Primary Examiner*—Stacy Whitmore
(74) *Attorney, Agent, or Firm*—Schmeiser, Olsen & Watts; Richard M. Kotulak (57) ABSTRACT

A method for reticle design correction and electrical parameter extraction of a multi-cell reticle design. The method including: selecting a subset of cell designs of a multi-cell reticle design, each cell design of the subset of cell designs having a corresponding shape to process, for each cell design of the subset of cell designs determining a respective cell design location of the corresponding shape; determining a common shapes processing rule for all corresponding shapes of each cell design based on the respective cell design locations of each of the corresponding shapes; and performing shapes processing of the corresponding shape only of a single cell design of the subset of cell designs to generate resulting data for the subset of cell designs. Also a computer usable medium including computer readable program code having an algorithm adapted to implement the method for reticle design correction and electrical extraction.

20 Claims, 6 Drawing Sheets

METHOD AND SYSTEM FOR PERFORMING SHAPES CORRECTION OF A MULTI-CELL RETICLE PHOTOMASK DESIGN

FIELD OF THE INVENTION

The present invention relates to the field of analyzing and modifying shapes on masks used for integrated circuit chip fabrication; more specifically, it relates a method for performing reticle enhancement and electrical parameter extraction on the design of integrated circuit chips.

BACKGROUND OF THE INVENTION

Integrated circuits are typically manufactured using a photomask called a reticle which may include multiple instances of the same integrated circuit chip in which case the reticle may be called a multi-chip reticle. The lithographic and other fabrication process used to transfer the pattern on the reticle into a photoresist layer and thence to underlying physical layers on a semiconductor substrate may not be uniform across the entire field of the reticle. Presently, in order to account for this non-uniformity, shapes processing procedures which will collectively be referred to here as reticle correction are performed to modify the patterns on the reticle so that the physical patterns created on the semiconductor substrate are closer to the design intent. Reticle correction is performed using one of two approaches. In the first approach, reticle correction is applied to every instance of the integrated circuit chip in the reticle design dataset. In this way the pattern modifications can be made to account for the location of shapes within the entire reticle. Since these techniques can take many days to weeks to run, even on the most powerful computer systems, it is often not cost effective to do so. In the second approach, the reticle correction is performed once to the chip design, and the modified pattern information is then duplicated in all instances of the chip on the reticle. This reduces the runtime requirements but does not allow for separate reticle correction modifications to be made to corresponding shapes in different instances of the chip on the reticle, and thus there is often a range in performance between integrated circuit chips formed from different instances of the integrated circuit chip on the reticle.

Electrical characteristics of structures in an integrated circuit chip such as resistance, capacitance, and transistor channel length, are normally determined from the set of shapes to be used to manufacture the chip using a shapes processing procedure known as electrical extraction. The non-uniformity across the reticle field in the lithographic and other fabrication processes may cause a manufactured pattern or structure created on the semiconductor substrate in different integrated circuit chips of a multi-chip reticle to differ, and hence to have different electrical characteristics. A conventional method of accounting for these varying electrical characteristics in electrical extraction is to report a range of values for a parameter (e.g., an electrical resistance) which bound the minimum and maximum values that the parameter have at any location within the reticle field. Because the shapes used to generate certain structures will occur only within limited areas of the reticle field, an electrical extraction process which reports such a wide range of parameter values will be pessimistic. This pessimism may cause an under-prediction of the performance of the integrated circuit, or may cause expenditure of unnecessary design effort, circuit area, or power to ensure that the integrated circuit will operate as desired.

Therefore, what is needed is a more cost-effective method for performing shapes processing procedures and for applying reticle enhancement and electrical extraction techniques, to instances of the integrated circuit on a multi-chip reticle.

SUMMARY OF THE INVENTION

A first aspect of the present invention is a method, comprising: selecting a subset of cell designs of a multi-cell reticle design, each cell design of the subset of cell designs having a corresponding shape to process, the subset of cells comprising at least two cell designs; for each cell design of the subset of cell designs determining a respective cell design location of the corresponding shape; determining a common shapes processing rule for all corresponding shapes of each cell design of the subset of cell designs based on the respective cell design locations of each of the corresponding shapes; and performing shapes processing of the corresponding shape only of a single cell design of the subset of cell designs to generate resulting data for the subset of cell designs.

A second aspect of the present invention is a computer program product, comprising a computer usable medium having a computer readable program code embodied therein, the computer readable program code comprising an algorithm adapted to implement a method for reticle design correction, the method comprising the steps of: selecting a subset of cell designs of a multi-cell reticle design, each cell design of the subset of cell designs having a corresponding shape to process, the subset of cells comprising at least two cell designs; for each cell design of the subset of cell designs determining a respective cell design location of the corresponding shape; determining a common processing rule for all corresponding shapes of each cell design of the subset of cell designs based on the respective cell design locations of each of the corresponding shapes; and performing processing of the corresponding shape only of a single cell design of the subset of cell designs to generate a processed cell design of the subset of cell designs.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

The present invention is applicable to conventional photomasks fabricated from a transparent substrate, for example glass, quartz, or other materials on which opaque features are formed, for example a feature of chrome or a dual layer of chrome over molybdenum. Areas of the substrate not covered by opaque features may be considered transparent or clear features.

The present invention is also applicable to phase shift photomasks in which notches have been formed to thin the transparent substrate immediately adjacent to the edges of the opaque features.

The present invention is further applicable to "chromeless" photomasks where the "opaque" features are regions of the substrate have zero radian phase shifts and "transparent" features are regions of the substrate having n or −n in phase shifts. It should be understood that the magnitude and phase of the radiation can be expressed as a complex quantity, and the intensity of the radiation is proportional to the real part of the square of that complex magnitude and phase (or, equivalently, to the product of that complex magnitude and phase with its complex conjugate). When radiation propagating through two different mask regions illuminates the same region of photoresist, the cumulative magnitude is the real part of the square of the sum of the complex magnitude and phase from the different sources. This cumulative magnitude controls the degree to which the photoresist in the region is exposed.

It should be further understood, that a photomask contains a cell region comprising one or more integrated circuit cells (hereinafter cells) and one or more kerf regions. Each chip cell is comprised of a pattern of opaque and clear features corresponding to structures of an integrated circuit chip (at a particular level of build of the integrated circuit chip). Each kerf region is comprised of a pattern of opaque and clear features corresponding to structures of an integrated circuit chip kerf (at the particular level of build of the integrated circuit chip).

In a photolithographic process of an integrated circuit manufacturing line, the pattern of opaque and clear features of the cell region will be transferred into a photoresist layer on a semiconductor wafer during fabrication of a level of an integrated circuit chip.

When photomasks are designed, the design comprises a dataset of shapes (often called a shapes file) that will define opaque (or clear features but not both) on the photomask, each shape defined by length, width and location on the photomask.

A reticle is a type of photomask. A reticle includes a number of cells that is less than the total number of integrated circuit chips to be fabricated on a single semiconductor wafer. The reticle is stepped across and the photoresist layer on the wafer exposed multiple times in order to define the full number of integrated circuit chips.

Figure 1A:
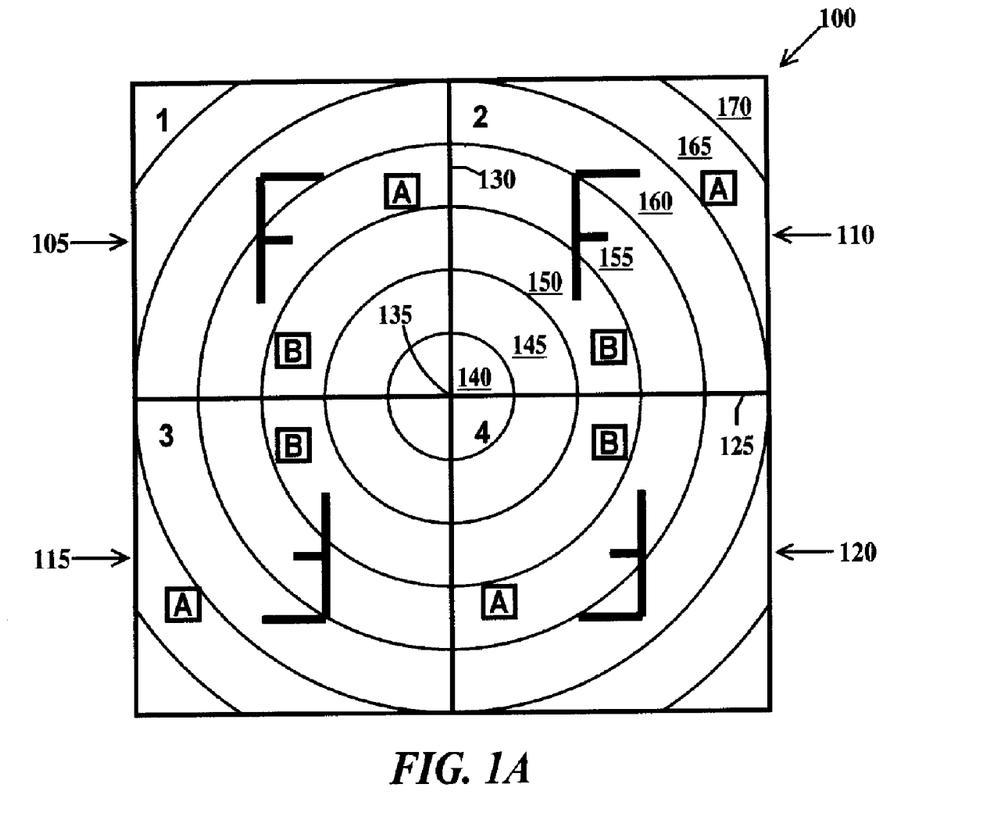
FIGS. 1A through 1H illustrate embodiments of the present invention applied to an exemplary multi-chip reticle design.

FIGS. 1A through 1H illustrate embodiments of the present invention applied to an exemplary multi-chip reticle design. It should be understood that FIGS. 1A through 1G are representations of a reticle design dataset. In FIG. 1A, an exemplary multi-chip photomask reticle (hereinafter reticle) 100 includes four integrated circuit chip design cells (hereinafter cells) 105, 110, 115 and 120 (also labeled 1, 2, 3 and 4 respectively) arranged in different quadrants of the reticle as defined by an X axis 125 and an orthogonal Y axis 130 crossing at an origin 135. In the example of FIG. 1A, origin 135 is also the center of cells 105, 110, 115 and 120 on reticle design 100. The F-shaped structure is merely an imaginary device to indicate topographical orientation of cells 105, 110, 115 and 120 relative to one another. In FIG. 1A, cells 105 and 110 have the same orientation while cells 115 and 120 have the same orientation but different from the orientation of cells 105 and 110. Cells 115 and 120 are rotated 180 degrees from cells 105 and 110. Cells 105, 110, 115 and 120 are arranged about origin 135.

Each cell 105, 110, 115 and 120 includes an exemplary A shape and an exemplary B shape in the same location within each cell. The B shapes are all located the same absolute X and Y distances from origin 135 and the A shapes are located the same absolute Y distances but two different absolute X distances from origin 135.

Also illustrated in FIG. 1A are concentric regions (hereinafter regions) 140, 145, 150, 155, 160, 165 and 170 centered on origin 135 and positioned at increasing distances from the origin. Regions 140, 145, 150, 155, 160, 165 and 170 represent an exemplary model of a systematic process variation (a process variability model) in the photolithographic process used to fabricate integrated circuits using reticle design 100 that may be corrected for by post-processing the design data set (also known as a shapes file). A systematic process variation causes a feature on the wafer to geometrically differ from the corresponding feature on the mask. An example of a photolithographic process variation that occurs in some photoresist systems is caused by non-uniform generation and diffusion of free radicals in the latent image (after exposure, but before development). Another example, is development or etch bias between the size of the shape on the mask and the size of the image formed on the wafer.

Post-processing known as optical proximity correction (OPC) or reticle enhancement techniques (RET) corrects for the systematic variation by altering the mask shape so the size and shape of the feature produced on the wafer are closer to those of the intended corresponding feature in the design. Each region 140, 145, 150, 155, 160, 165 and 170 has its own post-processing rules. A post-processing rule describes a geometric adjustment and the magnitude of the adjustment to be made to a shape to compensate or correct for the systematic process variation. Examples of post-processing rules include, but are not limited to amount of width bias to be applied to a design shape, amount of length bias to be applied to a design shape, locations of correction shapes to add to the design shape and the sizes and locations of correction features to be added to the design shape. Post-processing may or may not take into account shapes surrounding the shape to be processed. Although shown in the present example as concentric regions centered on the reticle center, regions sharing common post-processing rules may be distributed in different ways across the reticle field, e.g., in bands from side to side or from top to bottom of the reticle.

Electrical extraction is a shapes processing procedure whereby electrical parameters of interest, such as resistance, capacitance, or transistor channel length, are determined for an electrical circuit from a set of shapes used to produce that circuit on the semiconductor substrate. Electrical extraction processing uses extraction rules which do not normally depend on the location of shapes on the reticle. However, if location-dependent post-processing is not performed, or is not sufficient to eliminate all location-dependent variability in the structures produced on the semiconductor substrate, the electrical parameters of which the electrical extraction is required to determine may in fact depend on the position of the shapes on the reticle. Thus a more accurate electrical extraction process would use extraction rules which depend on the region of the reticle (e.g., region 140, 145, 150, 155, 160, 165, or 170 of FIG. 1).

The embodiments of the present invention deal with the case where post-processing or electrical extraction varies as a function of the process variability model. For example, shapes occurring in region 150 may be post-processed differently (e.g. less fore-shortening correction) than are shapes in region 155. However, to do post-process or electrical extraction separately for all four cells may be prohibitive in terms of cost and time. Therefore, embodiments of the present invention reduce the number of cell instances that need to be extracted or post-processed. In other words, if N is the number of cells on a reticle and K is the number of cells to be extracted or post-processed and embodiments of the present invention will extract or post-process a number of cells K that is less than N but greater than or equal to one. However, the specific cells extracted or post-processed are chosen so that at least the data representing one extracted or post-processed cell may replace the data representing a cell that was not extracted or post-processed as described infra.

FIGS. 1B, 1C, 1D and 1E represent a first embodiment of the present invention in which shapes are mapped onto a process variability model and the best possible post-processing for each shape is performed based on a process variability model.

Figure 1B:
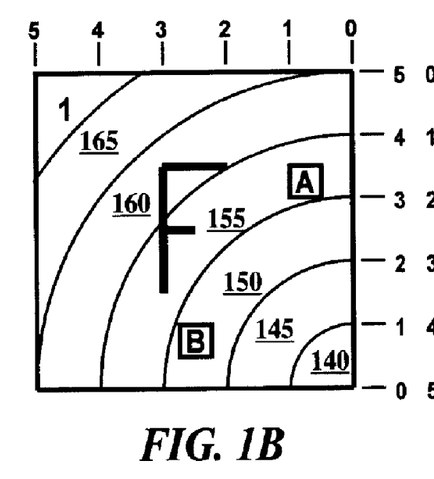
Figure 1C:
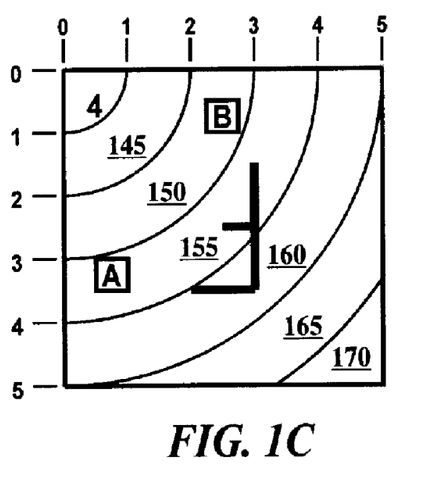

In FIGS. 1B and 1C, it can be seen that shapes A occur at the same X-Y coordinates on both cells 105 and 120 and in the same region 155 and shapes B occur at the same X-Y coordinates on both cells 105 and 120 and in the same region 150.

Thus, if cell 105 is post-processed using region 155 post processing rules for shape A and region 150 post processing rules for shape B, the post-processed data for cell 105 may be used for cell 120, only the orientation of the data for cell 105 need be changed to be used in place of the data for cell 120, which is far more cost effective than post-processing both cells 105 and 110.

Figure 1D:
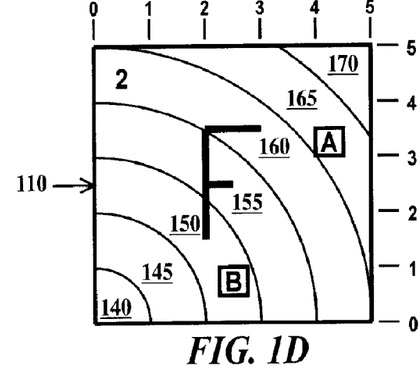
Figure 1E:
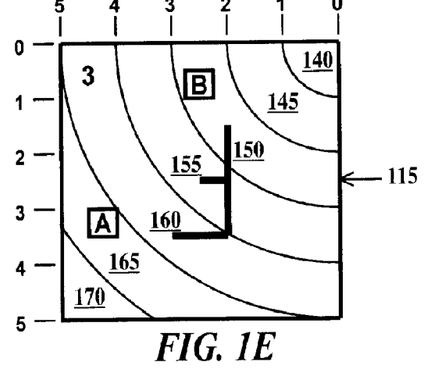

In FIGS. 1D and 1E, it can be seen that shapes A occur at the same X-Y coordinates on both cells 110 and 115 and in the same region 165 while the B shapes occur at the same X-Y coordinates on both cells 110 and 115 and in the same region 150. Thus, if cell 110 is post-processed using region 165 post processing rules shape A and region 150 post processing rules for shape B, the post-processed data for cell 110 may be used for cell 115, only the orientation of the data for cell 110 need be changed to be used in place of the data for cell 115.

Figure 1F:
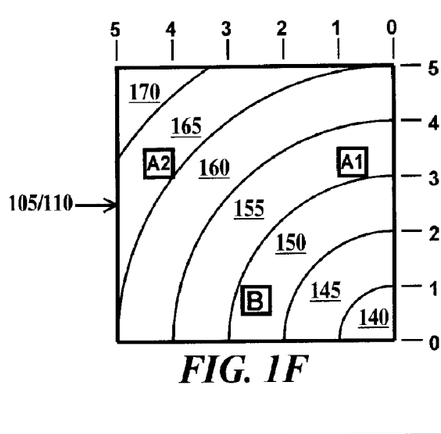

In FIG. 1F, cells 105 and 110 (see FIG. 1A) are mapped onto the same process variability model, by reflecting cell 110 about the y axis. Because the process variability map is symmetric about the origin, this reflection does not change the post-processing rule region into which any of the shapes of cell 110 are mapped. Note that in practice cell 105 would be more likely to be processed with cell 120, because, as described above, corresponding shapes in these cells fall into the same post-processing cell regions, and the mapping of cells 105 and 110 to a common process variability model is shown here for purposes of explanation of certain aspects of the present invention. The A shape of cell 105 (designated A1) occur at different X-Y coordinates than the A shape of cell 110 (designated A2). The A1 shape occurs in region 155 while shape A2 occurs in region 165. In order to apply the same post-processing rule to both shapes A1 and A2, the post-processing adjustment applied to shape A1 and A2 must be a compromise of the best possible post-processing for each shape. This may be expressed as a post-processing rule range which in the present example is (155, 165) in terms of post-processing regions or (rule for region 155, rule for region 165) in terms of post-processing rules. This range of post-processing rules is operated upon by a post-processing rule synthesis function to generate a comprise post-processing rule to apply to both shapes. There are many post-processing rule synthesis functions that may be used.

In a first example, the post-processing rule synthesis function generates a post-processing rule that is the average of the post-processing rule for region 155 and the post-processing rule for region 165 and the A shape of cell 105 would be processed using the average of these two post-processing rules. After post-processing cell 105, a copy of the post-processed cell 105 would be substituted for cell 110.

In a second example, the post-processing rule synthesis function selects the maximum of the post-processing rules for region 155 and 165 and the A shape of cell 105 would be processed using the maximum of the post-processing rules for region 155 and 165 and a copy of the post-processed cell 105 would be substituted for cell 110.

In a third example, the post-processing rule synthesis function selects the minimum of the post-processing rules for regions 155 and 165 and the A shape of cell 105 would be processed using minimum of the post-processing rules for regions 155 and 165. Then a copy of the post-processed cell 105 would be substituted for cell 110.

In a fourth example, each region 140, 145, 150, 155, 160, 165 and 170 may be given a different weight (for example, based on the critically of shapes in each region), and the post-processing rule synthesis function generates a rule that is a weighted average of the post-processing rules of the different regions in the range.

In a fifth example, the post-processing rule synthesis function selects the processing rule of the mid-region of region 155 and region 165 which is region 160 and the A shape of cell 105 would be processed using the post-processing rules of region 160. After post-processing cell 105, a copy of the post-processed cell 105 would be substituted for cell 110.

In a sixth example, the post-processing rule synthesis function selects the processing rule of furthest region from the common origin of the regions 155 and 165 which is region 165 and the A shape of cell 105 would be processed using the post-processing rules of region 165. After post-processing cell 105 a copy of the post-processed cell 105 would be substituted for cell 110.

In a seventh example, the post-processing rule synthesis function selects the post processing rule of the nearest region to the common origin of the regions which is region 155 and the A shape of cell 105 would be processed using the post-processing rules of region 155. Then a copy of the post-processed cell 105 would be substituted for cell 110.

Other, more complex post-processing rule synthesis functions other than average, minimum and maximum may be used as well.

Alternatively, the range of locations of the A shape within cells 105 and 110 could be expressed in terms of X,Y coordinates as ((0.75, 3.25), (4.25, 3.25) for FIGS. 1B and 1D) and post-processing rule synthesis based on distance from a dataset origin may be applied.

Figure 1G:
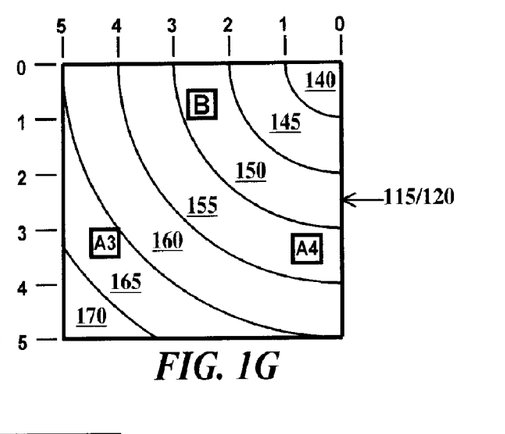

FIGS. 1F and 1G represent the first embodiment of the present invention applied to a different pair of cells.

In FIG. 1G, cells 115 and 120 (see FIG. 1A) are mapped onto the same process variability model, by reflecting cell 120 about the y axis. Because the process variability map is symmetric about the origin, this reflection does not change the post-processing rule region into which any of the shapes of cell 110 are mapped. Note that in practice cell 115 would be more likely to be processed with cell 110, because, as described above, corresponding shapes in these cells fall into the same post-processing cell regions, and the mapping of cells 115 and 120 to a common process variability model is shown here for purposes of explanation of certain aspects of the present invention. The A shape of cell 115 (designated A3) occur at different X-Y coordinates than the A shape of cell 120 (designated A4). The A3 shape occurs in region 165 while shape A4 occurs in region 155. In order to apply the same post-processing to both shapes A3 and A4, the post-processing correction applied to shape A3 and A4 must be a compromise of the best possible post-processing for each shape.

In a first example, the post-processing rule synthesis function generates a post-processing rule that is the average of the post-processing rules for regions 155 and 165 and the A shape of cell 115 would be processed using the average of the post-processing rules for regions 155 and 165. After post-processing cell 115, a copy of the post-processed cell 115 would be substituted for cell 120.

In a second example, the post-processing rule synthesis function selects the maximum of the post-processing rules for regions 155 and 165 and the A shape of cell 115 would be processed using the maximum of the post-processing rules for regions 155 and 165. After post-processing cell 115, a copy of the post-processed cell 115 would be substituted for cell 120.

In a third example, the post-processing rule synthesis function selects the minimum of the post-processing rules for regions 155 and 165 and the A shape of cell 110 would be processed using the minimum of the post-processing rules for regions 155 and 165. After post-processing cell 115, a copy of the post-processed cell 115 would be substituted for cell 120.

In a fourth example, the post-processing rule synthesis function selects the post-processing rule of the mid-region of region 155 and region 165 which is region 160 and the A shape of cell 115 would be processed the post-processing rules of region 160. After post-processing cell 115, a copy of the post-processed cell 115 would be substituted for cell 120.

In a fifth example, the post-processing rule synthesis function selects the post-processing rule of the furthest region from the common origin of the regions 155 and 165 which is region 165 and the A shape of cell 115 would be processed using the post-processing rules of region 165. After post-processing cell 115 a copy of the post-processed cell 115 would be substituted for cell 120.

In a sixth example, the post-processing rule synthesis function selects the post-processing rule of the nearest region to the common origin of the regions which is region 155 and the A shape of cell 115 would be processed using the post-processing rules of region 155. Then a copy of the post-processed cell 115 would be substituted for cell 120.

Figure 1H:
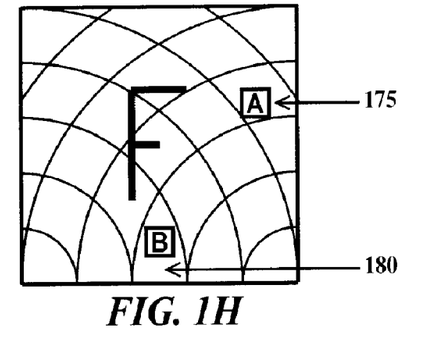

FIG. 1H represents a second embodiment of the present invention in which the process variability models for all cells are mapped onto a single cell and compromise post-processing for each shape is performed based on the composite process variability model.

In FIG. 1H, all cell 105, 110, 155 and 120 (see FIG. 1A) A shapes fall into a region 175 which is formed by overlaying a region 165 and a region 155 (since all A shapes are either in a region 155 or a region 165). Also all cell 105, 110, 155 and 120 (see FIG. 1A) B shapes fall into a region 180 which is formed by overlaying a region 150 and a region 150 (since all B shapes are in a region 150). A shapes are post-processed so that the variation between A shapes in any two cell instances are minimized.

In a first example, for A shapes region 175 post-processing rule synthesis function assigns a post-processing rule to region 175 that is the average the post-processing rules of regions 155 and 165 and all cell instances of A shapes are post-processed using region 175 post processing rules. All B shapes of all cell instances are post-processed using region 150 post processing rules.

In a second example, for A shapes region 175 the post-processing rule synthesis function assigns a post-processing rule to region 175 that is the post-processing rule of a region midway between region 155 and region 165 (i.e. region 160) and all cell instances of A shapes are post-processed using region 160 post processing rules. All B shapes of all cell instances are post-processed using region 150 post processing rules.

The post-processing steps described above in reference to FIGS. 1F, 1G, and 1H for the first and second embodiments of the present invention, may be replaced by electrical extraction steps. The post-processing regions and rules would be replaced by electrical extraction regions and rules. The resulting post-processed cells would be replaced by different sets of electrical parameters for each separate electrical extraction process.

The K sets of electrical parameters extracted in this manner could be used in a statistical or variation-aware static timing analysis or other statistical or variation-aware analysis. One form of variation-aware or statistical timing analysis is known as corner analysis, in which different analyses are performed using different combinations of independently varying parameters. For example, one analysis might be at high temperature, low supply voltage, and slow process, another at low temperature, high supply voltage, and fast process, and still another at low temperature, high supply voltage, and slow process. The K sets of extracted electrical parameters produced by the inventive method would be considered correlated, meaning that they would not vary independently, but instead that an analysis using one electrical parameter value from one of the K electrical extractions would also use all other parameter values from that same one of the K electrical extractions.

Figure 2A:
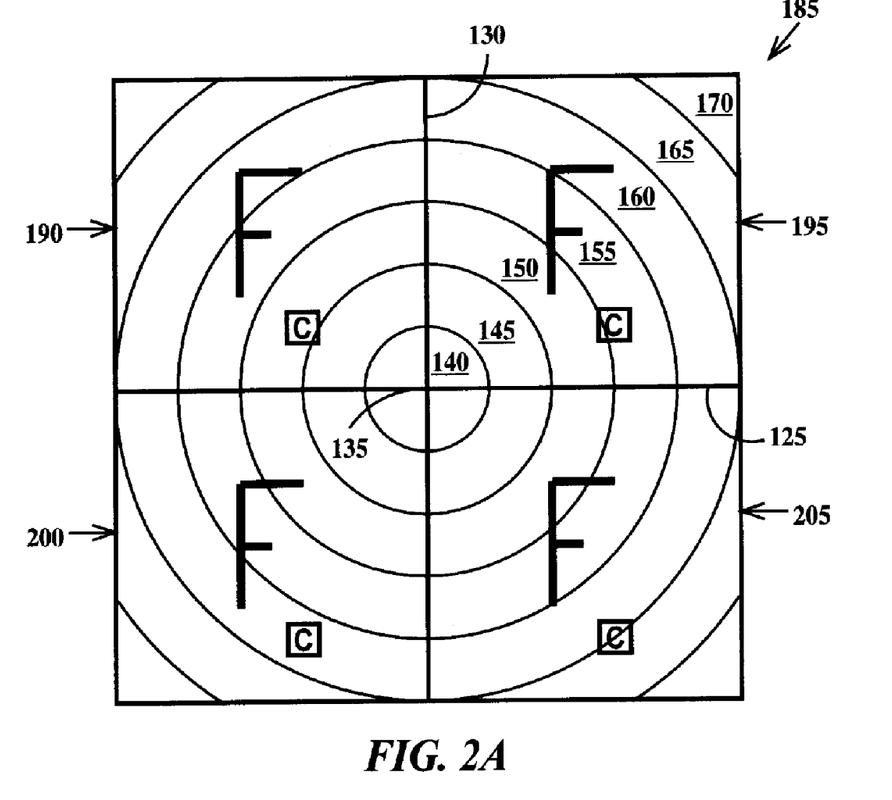
FIGS. 2A and 2B illustrate grouping of chip instances according to embodiments of the present invention applied to an exemplary multi-chip reticle design.
Figure 2B:
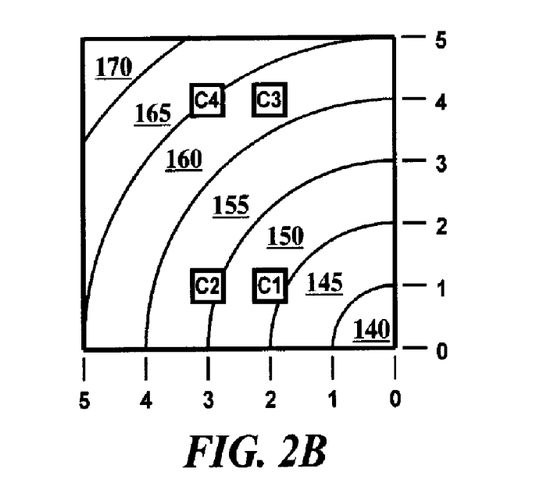

FIGS. 2A and 2B illustrate grouping of chip instances according to embodiments of the present invention applied to an exemplary multi-chip reticle design. Again, it should be understood that FIGS. 2A and 2B are representations of a reticle design dataset. In FIG. 2A, an exemplary reticle 185 includes four cells 190, 195, 200 and 205 arranged in different quadrants of the reticle as defined by X axis 125 and orthogonal Y axis 130 crossing at origin 135. In FIG. 2A, cells 190, 195, 200 and 205 have the same orientation. Each cell 190, 195, 200 and 205 includes an exemplary C shape all located the in the same position relative to respective cells 190, 195, 200 and 205 but in a different region of regions 140, 145, 150, 155, 160, 165 or 170.

In FIG. 2B, the C shapes of each cell 190, 195, 200 and 205 are mapped onto the same process variability model as C1, C2, C3 and C4 respectively, by rotating and mirroring cells 195, 200, and 205 onto cell 190, so that corresponding post-processing rule regions coincide. Taking all possible pairs of cells (and assuming uniform weight of regions 140, 145, 150, 155, 160, 165 and 170 and uniform increase or decrease in post-processing adjustment to be performed in each region) the following table may be constructed comparing the region and difference in region between each possible pairing of cells.

TABLE I

| SHAPE | REGION 1 | REGION 2 | |DELTA| |
|---|---|---|---|
| C1 & C2 | 150 | 155 | 5 |
| C1 & C3 | 150 | 160 | 10 |

TABLE I-continued

| SHAPE | REGION 1 | REGION 2 | \|DELTA\| |
|---|---|---|---|
| C1 & C4 | 155 | 165 | 15 |
| C2 & C3 | 155 | 160 | 5 |
| C2 & C4 | 155 | 165 | 10 |
| C3 & C4 | 160 | 165 | 5 |

From TABLE I, it can be seen that the minimum absolute difference in the post-processing (the variability) required between shapes in different regions occurs with the combinations of shapes C1 & C2, C2 & C3 and C3 & C4. However, the only combinations that include all four shapes are C1 & C2 and C3 & C4. Therefore, in this example, N is four and K is 2 gives a "best fit" comprise and two (the value of K=2) post-processing runs for 4 cells (N=4) would be performed. One of ordinary skill in the art may easily construct an algorithm to perform this determination for reticles containing any number of cells in any number of orientations and uniform or non-uniform variability between regions.

While region designations have been used in TABLE I, the magnitude of adjustment of the post-processing rules themselves may be used as illustrated in TABLE II.

TABLE II

| SHAPE | REGION 1 RULE | REGION 2 RULE | \|DELTA\| |
|---|---|---|---|
| C1 & C2 | Add 0.0150 micron/edge | Add 0.0155 micron/edge | 0.0005 micron/edge |
| C1 & C3 | Add 0.0150 micron/edge | Add 0.0160 micron/edge | 0.0010 micron/edge |
| C1 & C4 | Add 0.0155 micron/edge | Add 0.0165 micron/edge | 0.0015 micron/edge |
| C2 & C3 | Add 0.0155 micron/edge | Add 0.0160 micron/edge | .00005 micron/edge |
| C2 & C4 | Add 0.0155 micron/edge | Add 0.0160 micron/edge | 0.0010 micron/edge |
| C3 & C4 | Add 0.0160 micron/edge | Add 0.0160 micron/edge | 0.0005 micron/edge |

Alternatively, the value of K could be arbitrarily chosen based on other factors. For example, if post-processing time and/or cost prohibited more than a single post-processing run (K=1) then the maximum absolute difference between shapes in different regions would be between shape C1 and C4 (a value of 15) so variability of post-processing would be greater than for the case of K=2 described supra. For K=1 the variability is at its maximum.

The two methods of determining a value for K may be combined and one of ordinary skill in the art may easily construct an algorithm to perform a combined determination. For example, a reticle could have N cells and the maximum value of K may be selected, so that the groupings of cells to be "covered" by the same post-processing run results in neither the minimum or maximum variability.

In a similar manner, an electrical extraction rule might specify a capacitance value to be associated with a shape of a certain size in each electrical extraction region. Cells would be grouped to share electrical extraction in a way which minimizes the variation in the extracted capacitance and other values for the different shapes.

Figure 3A:
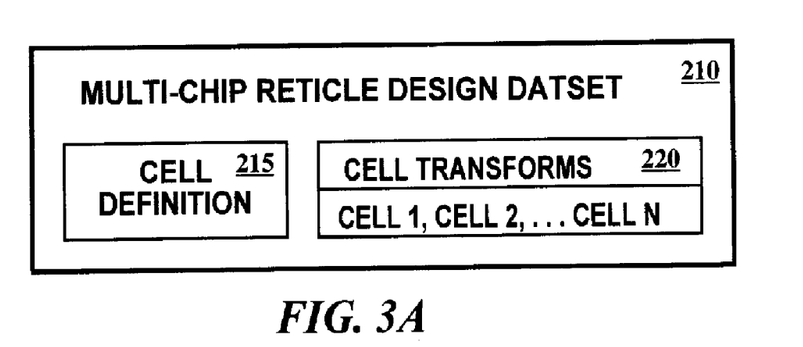
FIGS. 3A through 3C illustrate structures of a multi-chip reticle dataset.
Figure 3B:
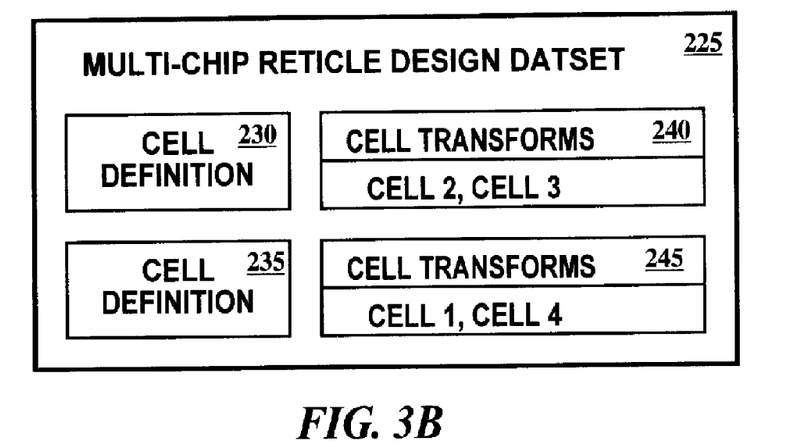
Figure 3C:
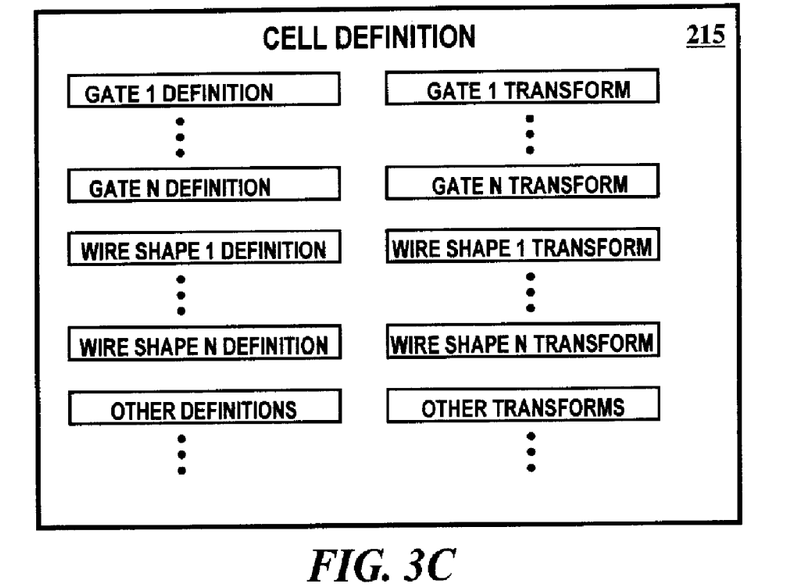

FIGS. 3A through 3C illustrate organization of a multi-chip reticle dataset. In FIG. 3A, a multi-chip reticle design dataset 210 includes a base cell definition 215 (see FIG. 3C) and cell transforms 220. Dataset 210 is a fully hierarchal (un-flattened) dataset. Base cell definition 215 defines the coordinates of shapes in a cell instance of a fixed orientation relative to an origin of a design grid on which the various shapes of the cell are placed. Cell transforms 220, define the translations to the cell origin (and hence all shapes within a cell instance) for each cell instance relative to a fixed reference on the multi-chip reticle. In the example of FIG. 1A, N=4 and the reticle reference was axes 125 and 130 and origin 135. Beside simple X-Y translation transforms, cell transforms 220 may include rotational and mirror transforms. Cell 215 (with K=1) may be post-processed according the embodiments of the present invention.

In FIG. 3B, a multi-chip reticle design dataset 225 illustrates the effect dataset of applying the embodiments of the present invention as described supra to reticle 100 of FIG. 1A with K=2. Since K is less than N but greater than N dataset 225 is a partially flattened data set. A fully flattened dataset for reticle 185 of FIG. 1A would occur with K=4 and there would be four (N) cell definitions and no transforms. Cell definitions 230 and 235 are based on the same cell definition (215 of FIG. 3A) but have been post-processed differently and cell transforms 220 have split into corresponding cell transforms 240 and 245.

Likewise, separate electrical extraction results for different sets of cell transforms could be generated and stored, in a manner similar to that in which separate cell transforms 240 and 245 are generated and stored.

FIG. 3B, illustrates that base cell definition 215 includes various repeated shape type definition and transforms. The embodiments of the present invention need not be applied to entire cells, but only to pre-selected shapes of the base cell definition. This is implemented by modification or selection of the process variability model so the variability is limited only to the pre-selected shapes. Thus, there is no requirement that the various cell definitions be identical only that they contain corresponding shapes.

The process variability model need not have a circular topology, but could have any topology including irregular topologies. Further the origin of the process variability model, the center of the set of cells and the center of the reticle need not be co-incident. Still further, cell images need not just be rotated, but may be mirrored. The first and second embodiments of the present invention need not be applied to every shape on a reticle, but may be applied to selected shapes or regions of shapes on the reticle.

Figure 4:
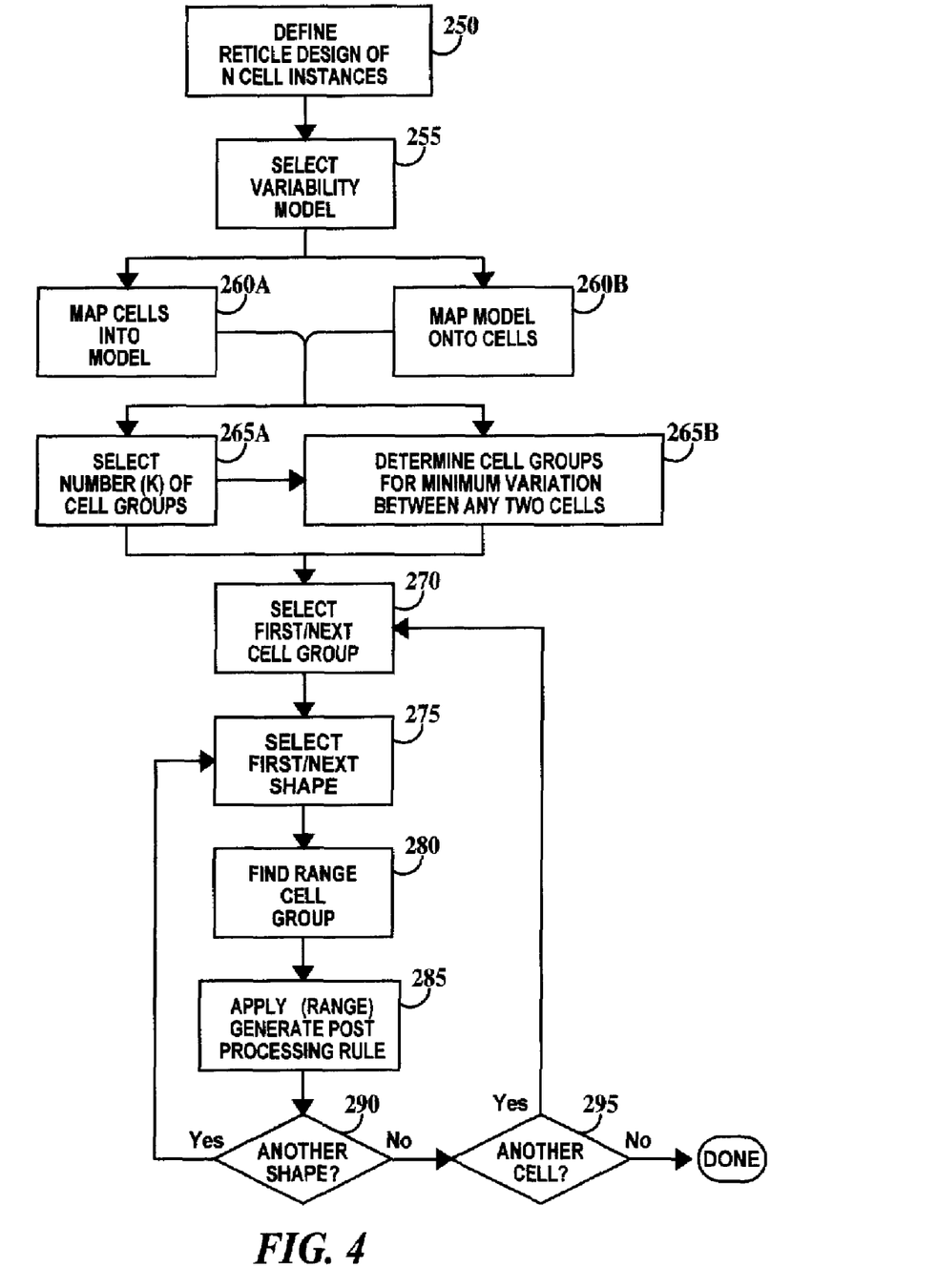
FIG. 4 is a flowchart of the method of embodiments of the present invention.

FIG. 4 is a flowchart of the method of embodiments of the present invention. In step 250, a reticle design of N instances a cell is defined. In step 255, a process variability model is selected. The method may then proceed to either step 260A or 260B. In step 260A, the cells are mapped onto the process variability model and in step 260B the process variability model is mapped onto the cell instances. From either step 260A or step 260B, the method proceeds to either step 265A or step 265B. In step 265A, the number of cell groups (K) is selected and the method proceeds either to step 265B or to step 270. In step 265B, cell instances are grouped such that the post-processing or electrical extraction variation between any two cell instances is determined and a group that has a minimum processing variation is selected. If step 265A was not performed, K is determined by step 265B. In Tables I and II, K is 2. If step 265A was performed, the value of K is used to screen out any combinations that result in a number of post-processing or electrical extraction operations different than K. Optionally, step 265B may include altering the design of the cells in order to minimize or reduce to zero the post-processing or electrical extraction variations between two or more cell instances. This may be done by moving shapes into regions of the cell where the electrical extraction or post-processing variation between cell instances on the reticle is reduced. Alternatively, it may be done by altering the local environment of certain shapes so that the applicable post-processing or electrical extraction rules for the shape exhibit smaller variation across the reticle field. From step 265B the method proceeds to step 270.

In step 270, the first/next cell group is selected. In step 275, the first/next shape to be post-processed or electrically extracted according to the embodiments of the present invention is selected. In step 280, the post-processing or electrical extraction rule range for the selected shape (based on the post-processing rules of the process variability model) is determined and in step 285 a post-processing or electrical extraction rule synthesis function is applied to the range data to generate compromise (which may be exact for one, multiple or all of the current shapes in each cell instance of the current cell group) post-processing or electrical extraction rule for the selected shape. In step 290, it is determined if another shape in the same cell group for which a special post-processing or electrical extraction rule needs to be formulated. If there is another shape, the method loops back to step 275, otherwise the method proceeds to step 295. In step 295, it is determined if another cell group in the reticle exists for which special post-processing or electrical extraction rules needs to be formulated. If there is another cell group, the method loops back to step 270, otherwise the method terminates.

Figure 5:
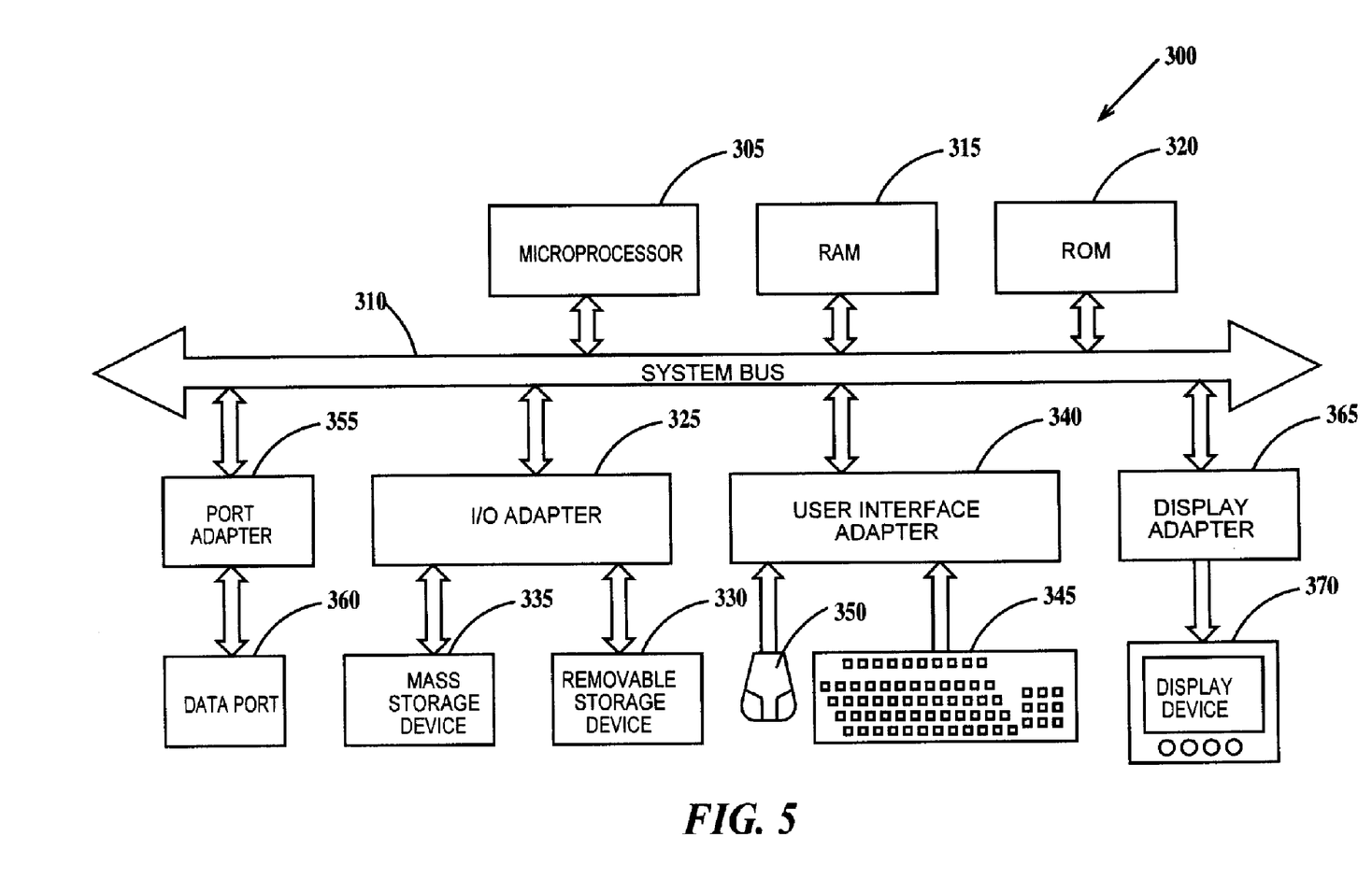
FIG. 5 is a schematic block diagram of a general-purpose computer for practicing the present invention.

FIG. 5 is a schematic block diagram of a general-purpose computer for practicing the present invention. Generally, the method described herein with respect to reticle enhancement is practiced with a general-purpose computer and the method may be coded as a set of instructions on removable or hard media for use by the general-purpose computer. FIG. 5 is a schematic block diagram of a general-purpose computer for practicing the present invention. In FIG. 5, computer system 300 has at least one microprocessor or central processing unit (CPU) 305. CPU 305 is interconnected via a system bus 310 to a random access memory (RAM) 315, a read-only memory (ROM) 320, an input/output (I/O) adapter 325 for a connecting a removable data and/or program storage device 330 and a mass data and/or program storage device 335, a user interface adapter 340 for connecting a keyboard 345 and a mouse 350, a port adapter 355 for connecting a data port 360 and a display adapter 365 for connecting a display device 370.

ROM 320 contains the basic operating system for computer system 300. The operating system may alternatively reside in RAM 315 or elsewhere as is known in the art. Examples of removable data and/or program storage device 330 include a semiconductor or solid state memory, magnetic tape, a removable computer diskette, a RAM, a ROM, a rigid magnetic disk and an optical disk. Current examples of optical disks include compact disk-read only memory (CD-ROM), compact disk-read/write (CD-R/W) and digital video disk (DVD). Examples of mass data and/or program storage device 335 include hard disk drives and non-volatile memory such as flash memory. In addition to keyboard 345 and mouse 350, other user input devices such as trackballs, writing tablets, pressure pads, microphones, light pens and position-sensing screen displays may be connected to user interface 340. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 330, fed through data port 360 or typed in using keyboard 345.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

Network adapters may also be coupled to the system, for example through data port 360, to enable the data processing system to become coupled to other data processing systems or remote printers or storage devices through intervening private or public networks. Modems, cable modem and Ethernet cards are just a few of the currently available types of network adapters.

The present invention may be applied to design simulations, extraction analysis or other types of design analysis to determine sensitivity of the design or reticle layout to systematic processing variations, wherein the simulations use datasets post-processed according to an embodiment of the present invention. Examples include, but are not limited to timing analysis, yield analysis, power analysis, and noise analysis.

Thus, the embodiments of the present invention provide a more cost-effective method for performing shapes processing procedures and for applying reticle enhancement and electrical extraction techniques, to instances of the integrated circuit on a multi-chip reticle.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
    selecting a subset of cell designs of a multi-cell reticle design, each cell design of said subset of cell designs having a corresponding shape to process, said subset of cells comprising at least two cell designs;
    for each cell design of said subset of cell designs determining a respective cell design location of said corresponding shape;
    determining a common shapes processing rule for all corresponding shapes of each cell design of said subset of cell designs based on said respective cell design locations of each of said corresponding shapes;
    performing shapes processing of said corresponding shape only of a single cell design of said subset of cell designs to generate resulting data for said subset of cell designs; and
    utilizing said resulting data to fabricate a multi-cell reticle photomask.

2. The method of claim 1:
    wherein said shapes processing includes post-processing said shapes in each cell design of said subset of cell designs, and said resulting data includes a processed cell design containing modified versions of said corresponding shapes; and further including replacing non-processed cell designs of said subset of cell designs with said processed cell design while retaining the topographical orientation and placement in said reticle design of each non-processed cell design replaced.

3. The method of claim 1, wherein said shapes processing includes electrical parameter extraction and said resulting data includes electrical parameters affected by said corresponding shapes.

4. The method of claim 1, wherein said common processing rule is based on systematic process variations in said cell design locations of a fabrication process for fabricating integrated circuit chips using a reticle fabricated based on said reticle design when said cell design locations are projected onto said reticle design.

5. The method of claim 4, further including:
selecting each cell design of said subset of cell designs such that differences between said systematic process variations in each cell design of said subset of cell designs is minimized.

6. The method of claim 5, further including:
altering said respective cell locations of one or more of said corresponding shapes in said cell design in order to minimize said systematic process variations in said cell design locations.

7. The method of claim 4, further including:
selecting each cell design of said subset of cell designs such that said systematic process variations in each cell design of said subset of cell designs are the same.

8. The method of claim 1, further including:
predetermining a maximum number of subsets of cell designs of said multi-cell reticle design.

9. The method of claim 1, wherein:
said processing is selected from the group consisting of optical proximity correction processing and reticle enhancement techniques processing.

10. The method of claim 1, wherein:
said common processing rule is an average, minimum, maximum, or weighted average of processing rules for regions of said reticle design in which said respective cell design locations occurs; or
said common processing rule is a processing rule for a region of all regions of said reticle design in which said respective cell design locations occur that is nearest, furthest or a median distance from a cell design location reference of said reticle design.

11. A computer program product, comprising a computer usable medium having a computer readable program code embodied therein, said computer readable program code comprising an algorithm adapted to implement a method for reticle design correction, said method comprising the steps of:
selecting a subset of cell designs of a multi-cell reticle design, each cell design of said subset of cell designs having a corresponding shape to process said subset of cells comprising at least two cell designs;
for each cell design of said subset of cell designs determining a respective cell design location of said corresponding shape;
determining a common processing rule for all corresponding shapes of each cell design of said subset of cell designs based on said respective cell design locations of each of said corresponding shapes;
performing processing of said corresponding shape only of a single cell design of said subset of cell designs to generate a processed cell design of said subset of cell designs; and
storing said processed cell design on a computer storage media or loading said processed cell design into a photomask manufacturing tool.

12. The computer program product of claim 11, the method further including;
replacing non-processed cell designs of said subset of cell designs with said processed cell design while retaining the topographical orientation and placement in said reticle design of each non-processed cell design replaced.

13. The computer program product of claim 11, wherein said corresponding shapes are identical.

14. The computer program product of claim 11, wherein said common processing rule is based on systematic process variations in said cell design locations of a fabrication process for fabricating integrated circuit chips using a reticle fabricated based on said reticle design when said cell design locations are projected onto said reticle design.

15. The computer program product of claim 14, the method further including:
selecting each cell design of said subset of cell designs such that differences between said systematic process variations in each cell design of said subset of cell designs is minimized.

16. The computer program product of claim 15, the method further including:
altering said respective cell locations of one or more of said corresponding shapes in said cell design in order to minimize said systematic process variations in said cell design locations.

17. The computer program product of claim 14, the method further including:
selecting each cell design of said subset of cell designs such that said systematic process variations in each cell design of said subset of cell designs are the same.

18. The computer program product of claim 11, the method further including:
predetermining a maximum number of subsets of cell designs of said multi-cell reticle design.

19. The computer program product of claim 11, wherein:
said processing is selected from the group consisting of optical proximity correction processing and reticle enhancement techniques processing.

20. The computer program product of claim 11, wherein:
said common processing rule is an average, minimum, maximum, or weighted average of processing rules for regions of said reticle design in which said respective cell design locations occurs; or
said common processing rule is a processing rule for a region of all regions of said reticle design in which said respective cell design locations occur that is nearest, furthest or a median distance from a cell design location reference of said reticle design.

* * * * *